(12) United States Patent
Emori (10) Patent No.: US 10,446,510 B2
(45) Date of Patent: Oct. 15, 2019

(54) PROCESS OF FORMING SEMICONDUCTOR APPARATUS MOUNTING ON SUBSTRATE

(71) Applicant: SUMITOMO ELECTRIC DEVICE INNOVATIONS, INC., Yokohama-shi (JP)

(72) Inventor: Masaomi Emori, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 78 days.

(21) Appl. No.: 15/900,961

(22) Filed: Feb. 21, 2018

(65) Prior Publication Data

US 2018/0240765 A1 Aug. 23, 2018

(30) Foreign Application Priority Data

Feb. 22, 2017 (JP) .................. 2017-031525

(51) Int. Cl.
*H01L 23/48* (2006.01)
*H01L 23/00* (2006.01)
*H01L 21/768* (2006.01)

(52) U.S. Cl.
CPC ........ *H01L 24/03* (2013.01); *H01L 21/76898* (2013.01); *H01L 23/481* (2013.01); *H01L 24/32* (2013.01); *H01L 24/83* (2013.01); *H01L 24/94* (2013.01); *H01L 2224/32506* (2013.01); *H01L 2224/83411* (2013.01); *H01L 2224/83444* (2013.01)

(58) Field of Classification Search
CPC . H01L 24/03; H01L 21/76898; H01L 23/481; H01L 24/32; H01L 24/94; H01L 24/83; H01L 2224/83444; H01L 2224/83411; H01L 2224/32506
See application file for complete search history.

(56) References Cited

U.S. PATENT DOCUMENTS

| | | | |
|---|---|---|---|
| 8,334,593 B2* | 12/2012 | McConnelee ......... | H01L 21/486 257/734 |
| 8,994,182 B2* | 3/2015 | Hagleitner ........ | H01L 21/28506 257/621 |
| 10,312,194 B2* | 6/2019 | Tuominen ............ | H01L 23/5383 |
| 2008/0305582 A1* | 12/2008 | Fillion ................ | H01L 23/4821 438/118 |
| 2010/0044842 A1* | 2/2010 | Mengel ................. | H01L 21/561 257/676 |
| 2010/0155940 A1* | 6/2010 | Kawashita .......... | H01L 21/6835 257/737 |
| 2013/0277845 A1* | 10/2013 | Chen ..................... | H01L 23/481 257/762 |

(Continued)

FOREIGN PATENT DOCUMENTS

JP   2015-035495 A   2/2015

*Primary Examiner* — Latanya N Crawford
(74) *Attorney, Agent, or Firm* — Baker Botts L.L.P.; Michael A. Sartori (57) ABSTRACT

A process of forming a semiconductor apparatus is disclosed. The process includes steps of: depositing a first metal layer containing Ni in a back surface of a substrate, plating the back surface of the substrate so as to expose the first metal layer in a portion of the scribe line, depositing a third metal layer on the whole back surface of the substrate, and selectively removing the third metal layer in the portion of the scribe line so as to leave the first metal layer in the scribe line.

14 Claims, 9 Drawing Sheets

(56) References Cited

U.S. PATENT DOCUMENTS

| | | | |
|---|---|---|---|
| 2014/0175664 A1* | 6/2014 | Hagleitner | H01L 23/5384 257/774 |
| 2014/0264868 A1* | 9/2014 | Radulescu | H01L 23/53247 257/751 |
| 2015/0140806 A1* | 5/2015 | Radulescu | H01L 23/53247 438/627 |
| 2016/0111293 A1* | 4/2016 | Hsieh | H01L 29/4175 438/111 |
| 2016/0197023 A1* | 7/2016 | Teshima | H01L 29/8611 257/288 |

* cited by examiner

PROCESS OF FORMING SEMICONDUCTOR APPARATUS MOUNTING ON SUBSTRATE

CROSS REFERENCE TO RELATED APPLICATIONS

The present application claims the benefit of priority of Japanese Patent Application No. 2017-031525, filed on Feb. 22, 2017, which is incorporated herein by reference.

1. FIELD OF INVENTION

The present invention relates to a process of forming a semiconductor apparatus, in particular, the invention relates to a process of the semiconductor apparatus that may enhance bond strength against an assembling substrate.

2. BACKGROUND ARTS

A semiconductor chip is generally mounted on a assembling substrate using, for instance, brazing material such as eutectic alloy or solder with low melting point, or electrically conductive resin. A Japanese Patent Application laid open No. JP-2015-035495A has disclosed a technique to mount a semiconductor device on the assembling substrate. However, in a case where a back surface of the semiconductor chip exposes a semiconductor material, typically, a semiconductor substrate thereof, such a semiconductor material generally shows lesser wettability with respect to the brazing material, which may deteriorate the bond strength of the semiconductor chip against the assembling substrate.

SUMMARY OF INVENTION

An aspect of the present invention relates to a process of forming a semiconductor apparatus that includes a semiconductor chip mounted on a mounting substrate with a brazing material. The process of the invention includes steps of: (a) preparing a substrate that include a top surface and a back surface opposite to the top surface, the top surface having an epitaxial layer thereon; (b) depositing a first metal layer on a whole of the back surface of the substrate; (c) plating the first metal layer with a second metal layer so as to expose a portion of the first metal layer corresponding to a scribe line that demarcate the semiconductor chip; (d) depositing a third metal layer on the second metal layer and the first metal layer in the scribe line that is exposed from the second metal layer; (e) removing the third metal layer so as to leave the first metal layer in the scribe line and the second metal layer in regions except for the scribe line; (f) dicing the substrate along the scribe line so as to form the semiconductor chip; and (g) mounting the semiconductor chip on the mounting substrate with the brazing material. The process of the present invention has features that the first metal layer contains nickel (Ni) and a metal material that shows wettability against the brazing material in a top of the first metal layer, and the third metal layer containing at least one of nickel (Ni) and titanium (Ti).

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, embodiment according to the present invention will be described as referring to accompanying drawings. In the description of the embodiment, numerals or symbols same with or similar to each other will refer to elements same with or similar to each other without duplicating explanations.

Figure 1A:
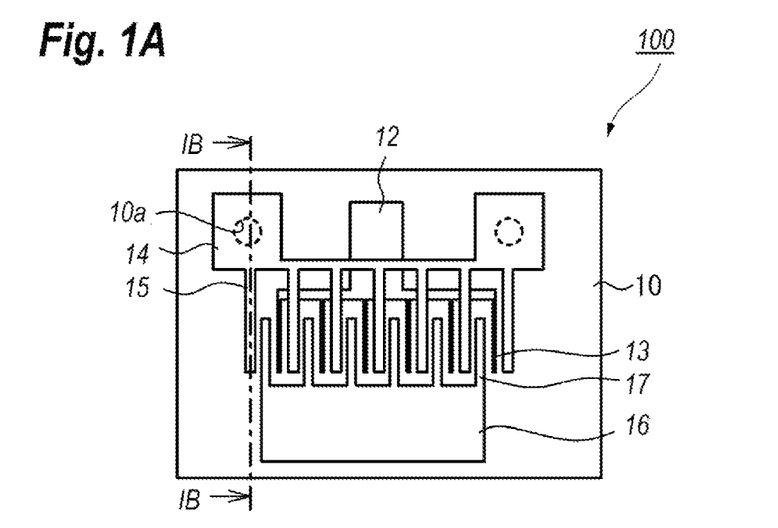
FIG. 1A is a plan view showing a semiconductor apparatus according to an embodiment of the present invention.

FIG. 1A shows a plan view of a semiconductor apparatus 100 according to the first embodiment of the present invention. The semiconductor apparatus 100 is a type of field effect transistor (FET) that includes a substrate 10, a gate pad 12, gate fingers 13, source pads 14, source fingers 15, a drain pad 16, and drain fingers 17. The epitaxial substrate 10 may include an insulating substrate made of silicon carbide (SiC) and epitaxial layers 19 grown on the insulating substrate 11. The epitaxial layers 19 include a channel layer made of gallium nitride (GaN), which is sometimes called as a carrier transporting layer, and a barrier layer made of, for instance, aluminum gallium nitride (AlGaN).

The pads and the fingers are provided on a top surface of the substrate 10. The fingers of the gate 13, the source 15, and the drain 17 extend from the pads of the gate 12, the source 14, and the drain 16, respectively, and in parallel to each other. The source finger 15 and the drain finger 16, where they overlap with the electrodes of the source 14 and the drain 15 that are formed by alloying stacked metals of titanium (Ti) and aluminum (Al), may be made of gold (Au), or preferably Ti and Au, and formed concurrently with the pads of the source 14 and the drain 15. While, the gate finger 13, which may be made of nickel (Ni) and palladium (Pd) stacked on Ni, are formed concurrently with the gate pad 12.

Figure 1B:
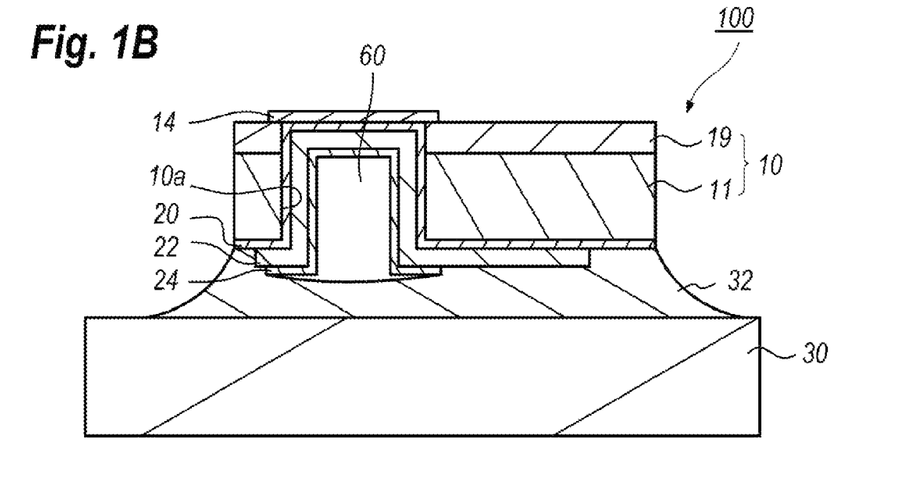
FIG. 1B shows a cross section of the semiconductor apparatus taken along the line IB-IB indicated in FIG. 1A.

FIG. 1B shows a cross section of the semiconductor apparatus 100, which is taken along the ling IB-IB indicated in FIG. 1A, where the semiconductor apparatus 100 is mounted on a assembling substrate 30. The substrate 10, as shown in FIG. 1A and FIG. 1B, provides a via 10a piercing from the back surface to the source pad 14 provided in the top surface of the substrate 10. That is, the source pad 14 may be operable as a stopper for the etching of the substrate 10.

The substrate 10 may further provide, in the back surface thereof, a metal layer 20, which will be called as the first metal layer, and a plated meal 22, which will be called as the second metal layer. The first metal layer 20 extends from the back surface of the substrate 10 to an inner wall wall of the via 10a, and finally in contact with the source pad 14. The plated metal 22, namely the second metal layer, is to be grounded when the semiconductor apparatus 100 is assembled and practically operated. The plated metal 22, which is formed by plating, exactly by electroplating the first metal layer using the metal layer 20 as a seed metal. The plated metal 22 extends on the metal layer 20 from an inside of the via 10a. The other metal layer 24, which will be called as the third metal layer, extends on the plated metal 22 also from the inside of the via 10a. The third metal layer 24 exposes the plated metal 22 in peripheries thereof, and the plated metal 22 exposes the first metal layer 20 also in peripheries thereof.

The first metal layer 20 may have a stacked structure of, from the side of the substrate 10, alloy of nickel (M) and chromium (Cr) with a thickness of 50 to 200 nm and gold (Au) with a thickness of also 50 to 200 nm, which will be denoted as NiCr/Au. The plated metal 22, as described above, may be formed by electroplated gold (Au). The third metal layer 24 may be made of, same with the first metal layer 20, alloy of nickel (Ni) and chromium (Cr), NiCr. The plated metal 22, exactly, gold (Au) has wettability against the brazing material 32 compared with NiCr in the first metal layer 20 and the third metal layer 24. The plated metal 22 in the present embodiment has a thickness of 5 to 10 µm, while, the third metal layer 24 has a thickness of 10 to 50 nm.

The semiconductor apparatus 100, as shown in FIG. 1B, is assembled with or mounted on the assembling substrate 30 using the brazing material 32 that may be made of, for instance, eutectic alloy of gold (Au) and tin (Sn), which may be denoted as AuSn, or conductive resin containing silver (Ag). The brazing material, in particular, eutectic alloy and/or conductive resin generally have poor wettability against materials containing nickel (Ni), such as NiCr of the first metal layer 20 and the third metal layer 24, the brazing material 32 is hard to penetrate within the via 10a. Accordingly, a vacant 60 is formed in the via 10a.

Figure 2A:
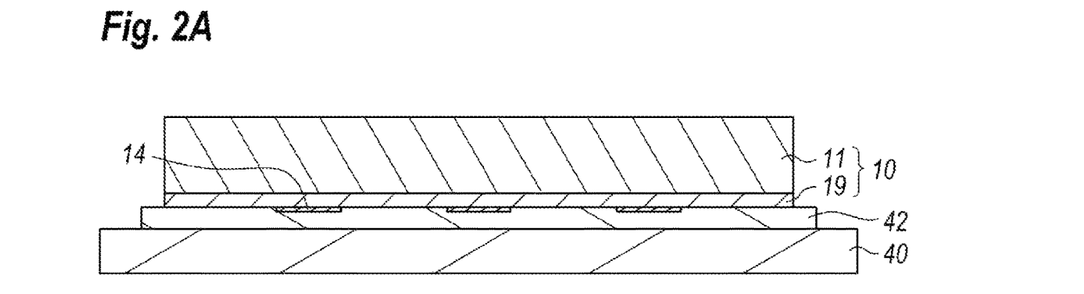
FIG. 2A to FIG. 2C show processes of forming the semiconductor apparatus shown in FIG. 1A and FIG. 1B.
Figure 2B:
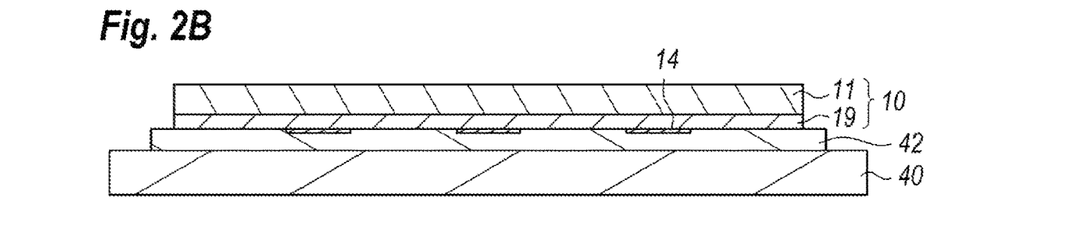
Figure 2C:
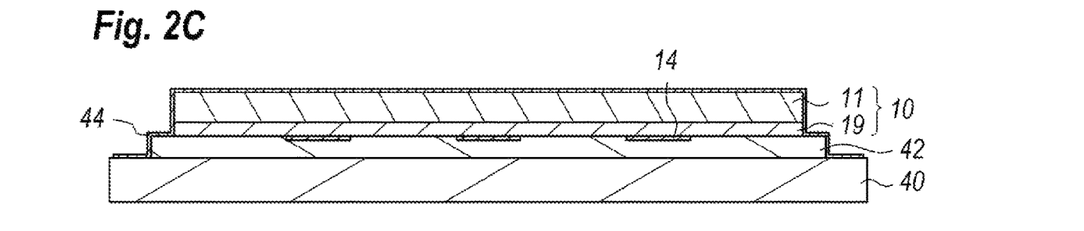

From FIG. 2A to FIG. 7C show processes of forming the semiconductor apparatus 100 according to the embodiment of the present invention. The process first forms the pads of the gate 12, the source 14, and the drain 16, and the fingers of the source 15 and the drain 17 on the top surface of the substrate 10 by a sequential process of the metal evaporation and the lift-off technique. In the figures, only the source pad 14 is illustrated. Then, the process attaches the substrate 10 to a supporting substrate 40, which may be made of glass, using wax 42 so as to face the top surface of the substrate 10 against the supporting substrate 40, as shown in FIG. 2A. Grinding the back surface of the substrate 10 to a thickness of, for instance about 100 µm, exactly 100±10 µm, which is shown in FIG. 2B, then, a metal layer 44 made of NiCr and Au is sequentially deposited on a whole back surface of the substrate 10 including edges thereof and a top surface of the supporting substrate 40 as shown in FIG. 2C, where NiCr is in contact with the substrate 10.

Figure 3A:
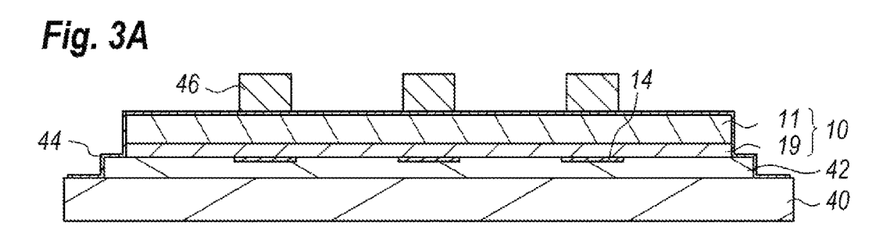
FIG. 3A to FIG. 3C show processes of forming the semiconductor apparatus that is subsequent to the process shown in FIG. 2C.
Figure 3B:
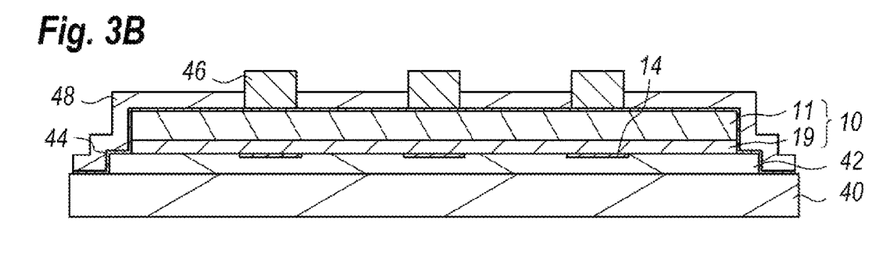
Figure 3C:
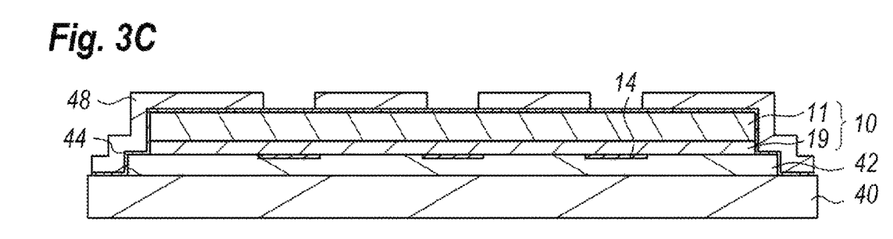

Then, a photoresist with striped pattern is prepared on the metal layer 44. The striped patterns 46 overlap with the source pads 14 in the top surface of the substrate 10, as shown in FIG. 3A. Thereafter, the electroplating using the metal layer 44 as a seed metal to supply currents foul's a metal mask 48 in regions except for the striped patterns 46 of the photoresist, as shown in FIG. 3B. Removing the striped pattern 46 of the photoresist, the metal mask 48 is left on the metal layer 44 as shown in FIG. 3C.

Figure 4A:
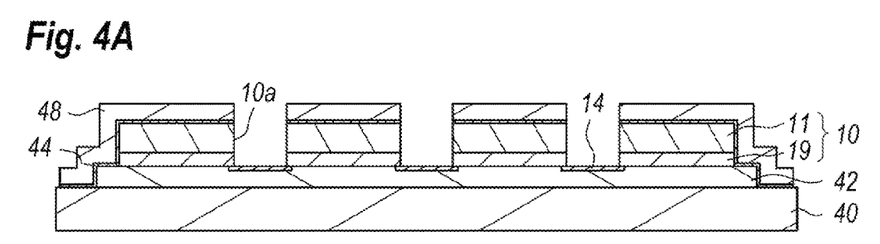
FIG. 4A to FIG. 4C show processes of forming the semiconductor apparatus that is subsequent to the process shown in FIG. 3C.
Figure 4B:
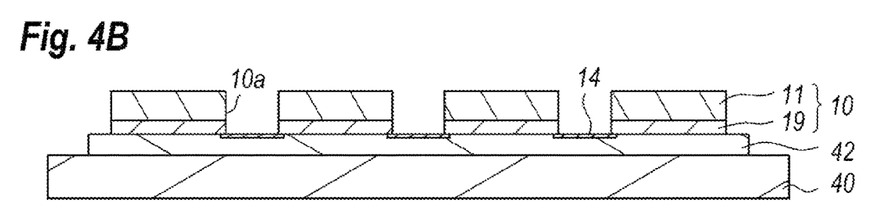
Figure 4C:
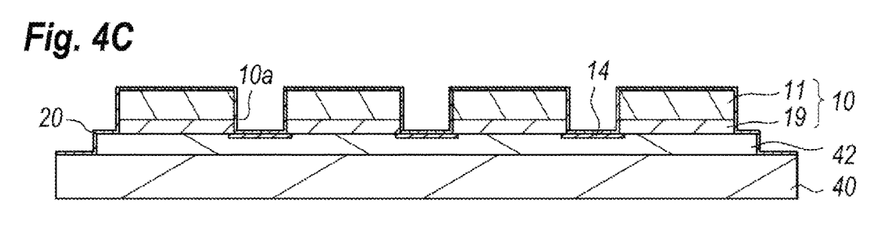

Etching the metal layer 44 and the substrate 10 by the metal mask 48 as an etching mask, the via 10a may be formed in positions overlapping with the source pad 14, as shown in FIG. 4A. The formation of the via 10a is considerably hard because of a thickness of the substrate 10 to be etched in the field of the semiconductor process, the process of the embodiment is necessary to prepare a mask endurable against the etching. Accordingly, the process of the present embodiment leaves the mask 48 made of metal. An etching carried out subsequent to the formation of the via 10a removes the metal mask 48 and the metal layer 44, as shown in FIG. 4B. Then, the first metal layer 20 is deposited by sequential sputtering of NiCr and Au on the whole back surface of the substrate 10, the inner wall of the via 10a, and the bottom of the via 10a, namely, on the source pad 14, as shown in FIG. 4C. The NiCr preferably has a thickness of 200 nm, while, gold (Au) preferably has a thickness of also 200 nm.

Figure 5A:
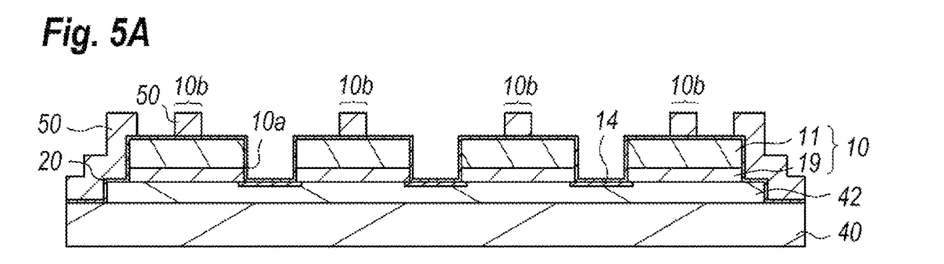
FIG. 5A to FIG. 5C show processes of forming the semiconductor apparatus that is subsequent to the process shown in FIG. 4C.
Figure 5B:
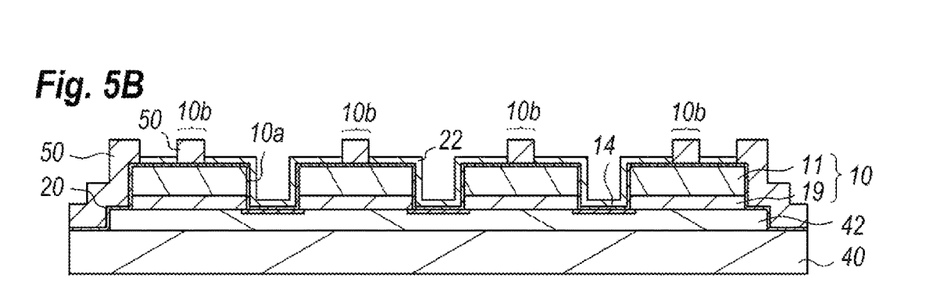
Figure 5C:
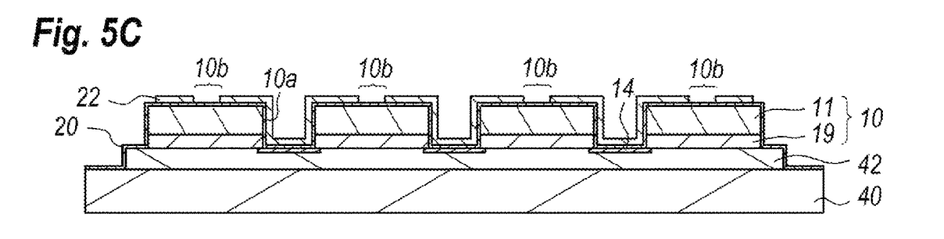

Thereafter, another striped pattern is formed by a photoresist 50 as shown in FIG. 5A. The photoresist 50 covers the peripheries of the substrate 10 and regions 10b where scribed lines are to be formed. The electroplating may form the plated metal 22 using the first metal layer 20 as the seed metal to supply currents during the electroplating, as shown in FIG. 5B. The plated metal 22 is formed in areas exposed from the photoresist 50. Removing the photoresist 50 as shown in FIG. 5C, the plated metal 22 exposes the first metal layer 20 in the areas where the scribe lines 10b are to be formed.

Figure 6A:
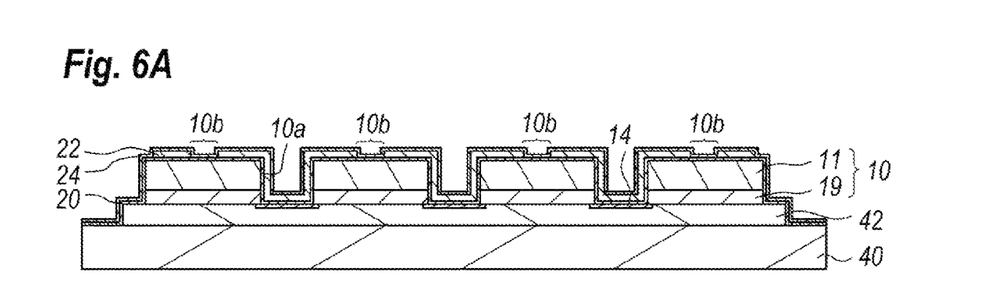
FIG. 6A to FIG. 6C show processes of forming the semiconductor apparatus that is subsequent to the process shown in FIG. 5C.

Thereafter, sputtering may deposit the third metal layer 24, which may be made of NiCr, on the whole surface of the plated metal 22 including the inner wall of the via 10a and the first metal layer 20 exposed from the plated metal 22. That is, the tri-layers of the first metal layer 20, the plated metal 22, and the third metal layer 24 are left on the whole back surface of the substrate 10 including the via 10a in the deep end and the inner wall thereof, while, the double layer of the first metal layer 20 and the third metal layer 24 is left in areas the scribe lines are to be formed, as shown in FIG. 6A.

Figure 6B:
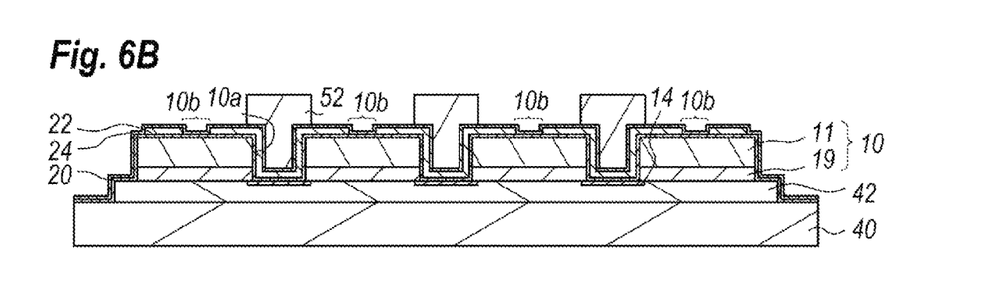
Figure 6C:
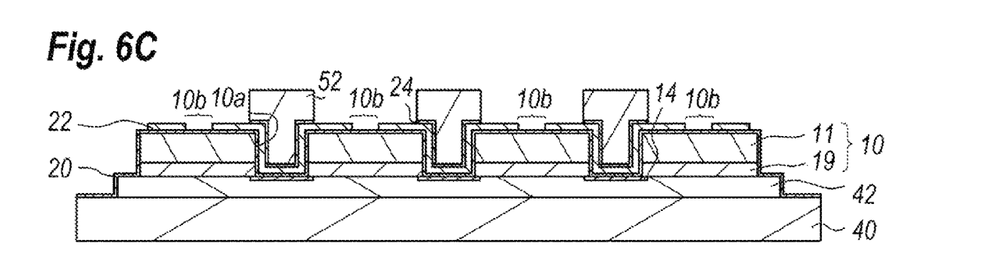

Then, the third photoresist 52 is patterned so as to cover the via 10a and peripheries of the via 10a as shown in FIG. 6B. Then an etchant containing iodine (I) may remove the third metal layer 24 on the plated metal 22 exposed from the third photoresist 52. Because the first metal layer 20 has gold (Au) on a top thereof, the present etching may not remove NiCr in the first metal layer 20. Thus, the scribe line 10b leaves the first metal layer 20 made of NiCr/Au, which may enhance bond strength of the substrate 10 against the brazing material 32, as shown in FIG. 6C. Also, the third metal layer 24 is left within the top inner wall, the top of the deep end thereof, and the peripheries of the via 10a.

The description above concentrates a combination of the first and third metal layers, 20 and 24, each made of NiCr/Au and NiCr; but other materials may be applicable to the first and third metal layers, 20 and 24. For instance, the top of the first metal layer 20 may provide copper (Cu), that is, the first metal layer has a stack of NiCr/Cu. In such a case, the third metal layer 24 may be made of titanium (Ti) and an ion milling using argon (Ar) ions and/or an etching using gases containing fluorine (F) may selectively remove titanium (Ti) in the third metal layer 24. The titanium (Ti) in the third metal layer 24 may be applicable to the first metal layer 20 made of stacked metals of NiCr/Au. Also, the deposition of those metals may be carried out, except for sputtering, by the metal evaporation.

Figure 7A:
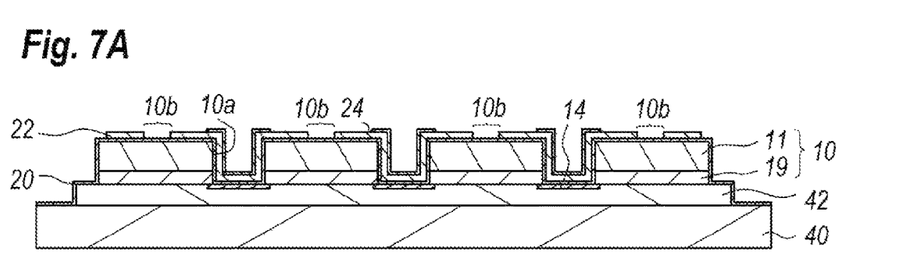
FIG. 7A to FIG. 7C show processes of forming the semiconductor apparatus that is subsequent to the process shown in FIG. 6C.
Figure 7B:
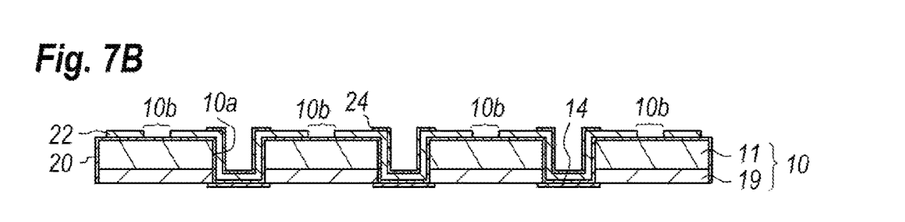
Figure 7C:
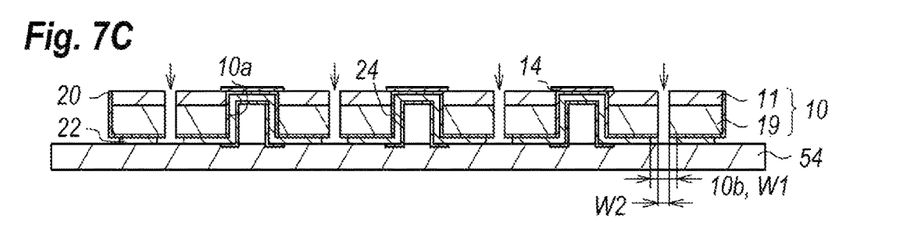

Referring to FIG. 7A, the process then removes the third photoresist 52. Then, the substrate 10 may be detached from the supporting substrate 40 by raising a temperature to 100 to 200° C., that is, melting the wax 42, which is shown in FIG. 7B. Cleaning the substrate 10 by organic solvent and attaching the substrate 10 onto to an expanding tape 54 such that the back surface thereof faces and is in contact with the expanding tape 54, as shown in FIG. 7C, the substrate 10 is divided into respective semiconductor apparatus 100 by dicing along the scribe lines 10b. The scribe line 10b preferably has a width W1 greater than a width W2 cut by the dicing, which is substantially equal to a thickness of dicing blade. Accordingly, the first metal layer 20 may be left in the peripheries of the respective chips of the semiconductor apparatus 100. That is, in the respective chips of the semiconductor apparatus 100 in the back surface thereof, the third metal layer 24 exposes the plated metal 22 in peripheries of the chips, and the plated metal 22 exposes the first metal layer 20 also in the peripheries of the respective chips. When the back surface of the substrate 10 is in contact with the brazing material 32 that is made of eutectic alloy of AnSn; the brazing material 32 spreads onto the first metal layer 20 and the plated metal 22. Although the first metal layer 20 includes NiCr with lesser wettability against the brazing material 32, the brazing material 32 spreads onto the first metal layer 20 because of the gold (Au) in the top thereof. Thus, solidifying the brazing material 32, the chip of the semiconductor apparatus 100 may be assembled with, or mounted on the assembling substrate 30.

Figure 8A:
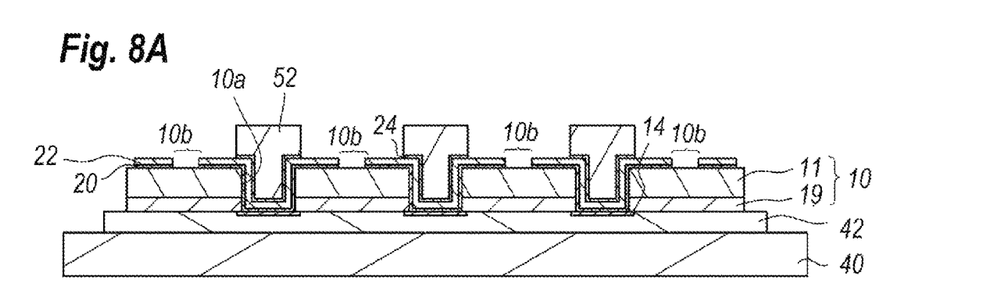
FIG. 8A and FIG. 8B show processes of forming a conventional semiconductor apparatus comparable to the semiconductor apparatus of the present invention.
Figure 8B:
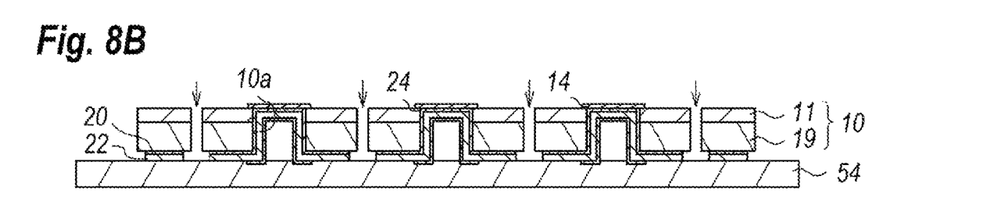

FIG. 8A and FIG. 8B show processes of assembling a semiconductor apparatus 200 according to a conventional technique, which is comparable to the embodiment described above. The conventional process removes the first metal layer 20 concurrently with the third metal layer 24 in the area where the scribe line 10b is to be forming. That is, after the removal of the third metal layer 24, no first metal layer is left in the scribe line as shown in FIG. 8A. Dicing the substrate 10 along the scribe lines 10b, the respective chips of the semiconductor apparatus leave no first metal layer 20 in the peripheries thereof but exposes the back surface of the substrate 10, FIG. 8B.

Figure 9:
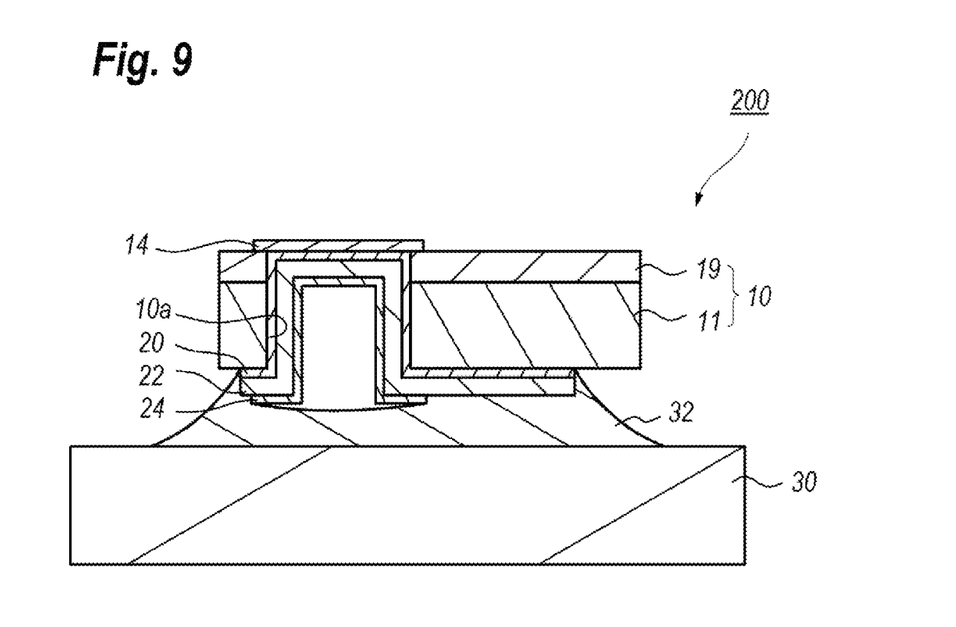
FIG. 9 shows a cross section of the conventional semiconductor apparatus comparable to the semiconductor apparatus of the present embodiment.

FIG. 9 magnifies the semiconductor apparatus 200 thus processed shown in FIG. 8A and FIG. 8B, where the semiconductor apparatus 200 is assembled on the assembling substrate 30. The substrate 10 and the third metal layer 24 containing nickel (Ni) generally have lesser wettability against the brazing material 32 of eutectic alloy compared with the plated metal 22. The brazing material 32, as shown in FIG. 9, spreads onto the plated metal 22 but is repelled on the third metal layer 24 and the back surface of the substrate 10. Thus, when the substrate 10 in a substantial portion of the back surface thereof provides areas showing lesser wettability against the brazing material 32, the substrate 10 is not stably in contact with the assembling substrate 30 and shows the lesser bond strength.

The embodiment of the preset invention, contrary to the conventional arrangement described above, the scribe line 10b of the substrate 10 may leave the first metal 20 even after the removal of the third metal layer 24. Because the top of the first metal layer 20 provides gold (Au) in the embodiment, or copper (Cu) in an alternative, not only the plated metal 22 but the first metal layer 20 in the scribe line 10b show the substantial wettability against the brazing material 32. Accordingly, the brazing material 32 may spread in the peripheries of the substrate 10, which may make the die-bonding on the assembling substrate 30 stable and enhance the bonding strength.

In the removal of the third metal layer 24, the first metal layer 20 in the scribe line 10b is necessary to be left. Accordingly, the first metal layer 20, at least a top thereof, preferably has a tolerance against an etchant for the third metal layer 24. In an example, the top of the first metal layer 20 is preferably made of gold (Au), while, the third metal layer is made of NiCr. In such a case, a chloric acid (HCl) in addition to that containing iodine (I) may be used as an etchant for selectively removing NiCr.

As shown in FIG. 1B, the substrate 10 provides the via 10a and the tri-structure of the first metal layer 20, the plated metal 22, and the third metal layer 24 is provided within the via 10 and the peripheries of the via 10a. Because the third metal layer 24 shows lesser wettability against the brazing material 32 compared with the plated metal 22 and the first metal layer 20, the brazing material 32 is hard to penetrate within the via 10a. When the brazing material 32 penetrates within the via 10a and solidifies thereat, the brazing material 32 possibly causes cracks in the plated metal 22 due to a difference in thermal expansion coefficients of the materials. In the embodiment of the present invention, the third metal layer 24 left in the peripheries of the via 10a and within the via 10a may effectively prevent the brazing material 32 from penetrating within the via 10a.

In the embodiment of the present invention, the first metal layer 20 may include nickel (Ni), while, the third metal layer 24 may include nickel (Ni) or titanium (Ti). The top of the first metal layer 20 and the plated metal 22 may include materials same with each other. For instance, the layers may include gold (Au) that show good wettability against the brazing material 32. The top of the first metal layer 20 and the plated metal 22 may include copper (Cu) except for gold (Au), while, the third metal layer 24 may include titanium (Ti). Those combinations of the top of the first metal layer 20, the plated metal 22, and the third metal layer 24 may show excellent selectivity for the removal of only the third metal layer 24 as showing good wettability against the brazing material 32.

The first metal layer 20 exposed from the plated metal 22 preferably has an area greater than 10% with respect to the whole back surface of the substrate 10 in order to enhance the bond strength against the assembling substrate 30 by the brazing material 32.

The epitaxial layer 19 may include nitride semiconductor layers, such as gallium nitride (GaN), aluminum gallium nitride (AlGaN), indium gallium nitride (InGaN), indium nitride (InN), indium aluminum gallium nitride (InAlGaN) and so on. The substrate 10 may also include arsenic materials, such as gallium arsenide (GaAs), aluminum gallium arsenide (GaAlAs), and so on. The substrate 10 in the insulating substrate 11 thereof may include silicon carbide (SiC), silicon (Si), sapphire ($Al_2O_3$) for the nitride semiconductors above listed, while, gallium arsenide (GaAs) for the arsenic semiconductors.

Although the present invention has been described in certain specific exemplary embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive; accordingly, the scope of the invention should be determined by the appended claims and their equivalents.

What is claimed is:

1. A process of forming a semiconductor apparatus that includes a semiconductor chip mounted on a mounting substrate with a brazing material, the process comprising steps of:
    preparing a substrate that includes a top surface and a back surface opposite to the top surface, the top surface having an epitaxial layer thereon;
    depositing a first metal layer on a whole of the back surface of the substrate, the first metal layer containing nickel (Ni) and a metal material in a top of the first metal layer, the metal material that shows wettability against the brazing material;
    plating the first metal layer with a second metal layer so as to expose a portion of the first metal layer corresponding to a scribe line that demarcate the semiconductor chip;
    depositing a third metal layer on the second metal layer and the first metal layer in the scribe line that is exposed from the second metal layer, the third metal layer containing at least one of nickel (Ni) and titanium (Ti);
    removing the third metal layer so as to leave the first metal layer in the scribe line and the second metal layer in regions except for the scribe line;
    dicing the substrate along the scribe line so as to form the semiconductor chip; and
    mounting the semiconductor chip on the mounting substrate with the brazing material.

2. The process according to claim 1,
    wherein the step of plating the back surface includes a step of electroplating the second metal layer made of gold (Au) by the first metal layer as a seed metal.

3. The process according to claim 1,
    wherein the step of depositing the first metal layer includes a step of sequentially depositing alloy of nickel (Ni) and chromium (Cr), and gold (Au) on the alloy.

4. The process according to claim 3,
    wherein the step of depositing the first metal layer includes a step of sequentially depositing the alloy by a thickness of 50 to 200 nm and the gold by a thickness of 50 to 200 nm.

5. The process according to claim 3,
    wherein the step of depositing the third metal layer includes a step of depositing alloy of nickel (Ni) and chromium (Cr) by a thickness of 10 to 50 nm, and
    wherein the step of removing the third metal layer includes a step of etching the third metal layer using an etchant containing iodine (I).

6. The process according to claim 3,
    wherein the step of depositing the third metal layer includes a step of depositing titanium (Ti) by a thickness of 10 to 50 nm, and
    wherein the step of removing the third metal layer includes a step of etching the third metal layer using a reactive gas containing fluorine (F).

7. The process according to claim 1,
    wherein the step of depositing the first metal layer includes a step of sequentially depositing alloy of nickel (Ni) and chromium (Cr), and copper (Cu) on the alloy.

8. The process according to claim 7,
    wherein the step of depositing the first metal layer includes a step of sequentially depositing the alloy by a thickness of 50 to 200 nm and the copper (Cu) by a thickness of 50 to 200 nm.

9. The process according to claim 7,
    wherein the step of depositing the third metal layer includes a step of depositing alloy of nickel (Ni) and chromium (Cr) by a thickness of 10 to 50 nm, and
    wherein the step of removing the third metal layer includes a step of milling the third metal layer using argon ions.

10. The process according to claim 7,
    wherein the step of depositing the third metal layer includes a step of depositing titanium (Ti) by a thickness of 10 to 50 nm, and
    wherein the step of removing the third metal layer includes a step of etching the third metal layer using a reactive gas containing fluorine (F).

11. The process according to claim 1,
    wherein the step of mounting the semiconductor chip includes a step of mounting the semiconductor chip using eutectic alloy of gold-tin (AuSn).

12. The process according to claim 1,
    wherein the step of mounting the semiconductor chip includes a step of mounting the semiconductor chip using conductive resin.

13. The process according to claim 1,
    wherein the step of plating the second metal layer includes a step of electroplating the first metal layer with gold (Au) by a thickness of 5 to 10 μm.

14. The process according to claim 1,
    further including steps of, before depositing the first metal layer,
    grinding the substrate in the back surface thereof until a thickness of 100±10 μm, and
    forming a via piercing the substrate from the back surface to the top surface thereof,
    wherein the first metal layer, the second metal layer, and the third metal layer cover an inside of the via, and
    wherein the step of removing the third metal layer includes a step of leaving the third metal layer within the via and around the via.

* * * * *